US009281250B2

(12) United States Patent
Oh et al.

(10) Patent No.: US 9,281,250 B2
(45) Date of Patent: Mar. 8, 2016

(54) METHOD OF DETECTING AN ASYMMETRIC PORTION OF AN OVERLAY MARK AND METHOD OF MEASURING AN OVERLAY INCLUDING THE SAME

(71) Applicant: SAMSUNG ELECTRONICS CO., LTD., Suwon-Si, Gyeonggi-Do (JP)

(72) Inventors: Seung-Hwa Oh, Hwaseong-si (JP); Jeong-Jin Lee, Asan-si (KR); Chan Hwang, Seoul (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/539,629

(22) Filed: Nov. 12, 2014

(65) Prior Publication Data
US 2015/0294916 A1 Oct. 15, 2015

(30) Foreign Application Priority Data
Apr. 15, 2014 (KR) .......................... 10-2014-0044655

(51) Int. Cl.
*H01L 21/66* (2006.01)
*G01R 31/26* (2014.01)
(Continued)

(52) U.S. Cl.
CPC .............. *H01L 22/12* (2013.01); *G06T 7/0046* (2013.01); *G09G 5/377* (2013.01); *G06T 2207/10004* (2013.01); *G06T 2207/30148* (2013.01); *G06T 2215/16* (2013.01)

(58) Field of Classification Search
CPC .............. H01L 21/00; H01L 21/67173; H01L 21/67178; H01L 22/00; H01L 22/10; H01L 23/00; H01L 23/5283; H01L 25/00

USPC ..................... 438/14, 15, 179, 286, 400, 401; 257/E21.499, E21.521, E21.522, 257/E21.524, E21.525, E21.528, E21.529, 257/E21.53
See application file for complete search history.

(56) References Cited

U.S. PATENT DOCUMENTS 6,218,200 B1 * 4/2001 Chen ................... G03F 7/70633
438/14
6,801,313 B1 * 10/2004 Yokota ................ G03F 7/70633
356/401

(Continued)

FOREIGN PATENT DOCUMENTS

JP 2002-203769 7/2002
KR 1998-65656 10/1998
(Continued)

*Primary Examiner* — David Nhu
(74) *Attorney, Agent, or Firm* — F. Chau & Associates, LLC

(57) ABSTRACT

A method of detecting an asymmetric portion of an overlay mark includes forming a plurality of virtual overlay marks having a plurality of virtual asymmetric portions. The virtual asymmetric portions may have different sizes with respect to a reference model profile of a reference overlay mark. Virtual information with respect to each virtual overlay mark may be obtained. The virtual information of the virtual overlay marks may be compared with actual information of an actual overlay mark to identify virtual information of the virtual overlay mark corresponding to the actual information of the actual overlay mark. Thus, measuring the overlay of the actual overlay mark may be performed under than the actual asymmetric portion may be excluded from the actual overlay mark, so that the overlay may be accurately measured. As a result, errors may not be generated in a correcting process to a layer using the accurate overlay.

20 Claims, 9 Drawing Sheets

(51) Int. Cl.
   *G09G 5/377*   (2006.01)
   *G06T 7/00*    (2006.01)

(56) References Cited

U.S. PATENT DOCUMENTS

| | | | |
|---|---|---|---|
| 7,180,593 B2 * | 2/2007 | Lin | G03F 7/70633 356/401 |
| 7,190,823 B2 * | 3/2007 | Chen | G03F 7/70633 382/151 |
| 7,323,393 B2 * | 1/2008 | Yen | G03F 7/70633 438/401 |
| 7,602,072 B2 | 10/2009 | Kim et al. | |
| 7,804,994 B2 * | 9/2010 | Adel | G03F 7/705 382/151 |
| 8,363,218 B2 * | 1/2013 | Den Boef | G03F 7/70633 356/399 |
| 2009/0073448 A1 | 3/2009 | Tenner et al. | |
| 2013/0035888 A1 | 2/2013 | Kandel et al. | |
| 2013/0148121 A1 | 6/2013 | Den Boef et al. | |

FOREIGN PATENT DOCUMENTS

| | | |
|---|---|---|
| KR | 10-2001-0088997 | 9/2001 |
| KR | 10-2005-0039086 | 4/2005 |

* cited by examiner

METHOD OF DETECTING AN ASYMMETRIC PORTION OF AN OVERLAY MARK AND METHOD OF MEASURING AN OVERLAY INCLUDING THE SAME

CROSS-REFERENCE TO RELATED APPLICATION

This application claims priority under 35 USC §119 from Korean Patent Application No. 10-2014-044655, filed on Apr. 15, 2014 in the Korean Intellectual Property Office (KIPO), the contents of which are herein incorporated by reference in their entirety.

BACKGROUND

1. Technical Field

Exemplary embodiments are directed to a method of detecting an asymmetric portion of an overlay mark and a method of measuring an overlay including the same. More particularly, exemplary embodiments are directed to a method of detecting an asymmetric portion formed at an overlay mark, and a method of measuring an overlay including the detecting method.

2. Description of the Related Art

Generally, a plurality of layers may be sequentially formed on a semiconductor substrate. To manufacture a desired semiconductor device, the layers are formed at predetermined positions on the semiconductor substrate.

Overlay marks are used for identifying alignments of the layers. The alignments of the layers may be identified by measuring overlays of the overlay marks.

To accurately measure the overlay of the overlay mark, a symmetric overlay mark can be provided. If the overlay mark has an asymmetric portion with respect to a center point of the overlay mark, the center point of the overlay mark may be shifted from an original point toward the asymmetric portion. This may cause a difference between the measured overlay and an actual overlay. As a result, errors may be generated in a correcting process with respect to the layer using the measured overlay.

SUMMARY

Exemplary embodiments provide a method of detecting an asymmetric portion of an overlay mark.

Exemplary embodiments also provide a method of measuring an overlay including the above-mentioned detecting method.

According to exemplary embodiments, there may be provided a method of detecting an asymmetric portion of an overlay mark. In the method of detecting the asymmetric portion of the overlay mark, a plurality of virtual overlay marks having a plurality of virtual asymmetric portions may be formed. The virtual asymmetric portions may have different sizes with respect to a reference model profile of a reference overlay mark. Virtual information with respect to each of the virtual overlay marks may be obtained. The virtual information of the virtual overlay marks may be compared with actual information of an actual overlay mark to identify virtual information of the virtual overlay mark corresponding to the actual information of the actual overlay mark.

In exemplary embodiments, forming the virtual overlay marks may include drawing a virtual asymmetric line from a first point apart from a lower end of a first side surface of the reference model profile along a second side surface of the reference model profile substantially opposite to the first side surface through an upper surface of the reference model profile, and shifting the virtual asymmetric line to a second point apart from a lower end of the second surface.

In exemplary embodiments, a distance between the lower end of the first surface and the first point may be substantially the same as a distance between the lower end of the second surface and the second point.

In exemplary embodiments, shifting the virtual asymmetric line may include shifting the virtual asymmetric line by substantially the same interval.

In exemplary embodiments, the detecting method may further include identifying an actual asymmetric portion of the actual overlay mark.

In exemplary embodiments, identifying the actual asymmetric portion of the actual overlay mark may include amplifying an actual model profile of the actual overlay mark, and identifying changes of a center point of the amplified actual model profile.

In exemplary embodiments, amplifying the actual model profile of the actual overlay mark may include squaring the actual model profile of the actual overlay mark to integers.

In exemplary embodiments, the virtual information of the virtual asymmetric portions may include a size and a position of each of the virtual asymmetric portions.

In exemplary embodiments, the size of the virtual asymmetric portion may include a horizontal length of the virtual asymmetric portion.

According to exemplary embodiments, there may be provided a method of measuring an overlay. In the method of measuring an overlay, a plurality of virtual overlay marks having a plurality of virtual asymmetric portions may be formed. The virtual asymmetric portions may have different sizes with respect to a reference model profile of a reference overlay mark. Virtual information with respect to each of the virtual overlay marks may be obtained. The virtual information of the virtual overlay marks may be compared with actual information of an actual overlay mark to identify virtual information of the virtual overlay mark corresponding to the actual information of the actual overlay mark. The overlay of the actual overlay mark may be measured using the corresponding virtual information of the virtual overlay mark.

In exemplary embodiments, measuring the overlay of the actual overlay mark may include excluding an actual asymmetric portion from the actual overlay mark.

In exemplary embodiments, the measuring method may further include identifying an actual asymmetric portion of the actual overlay mark.

In exemplary embodiments, identifying the actual asymmetric portion of the actual overlay mark may include amplifying an actual model profile of the actual overlay mark, and identifying changes of a center point of the amplified actual model profile.

In exemplary embodiments, amplifying the actual model profile of the actual overlay mark may include squaring the actual model profile of the actual overlay mark to integers.

In exemplary embodiments, the virtual information of the virtual asymmetric portions may include a size and a position of each of the virtual asymmetric portions, and center points of the virtual overlay marks.

In exemplary embodiments, the size of the virtual asymmetric portion may include a horizontal length of the virtual asymmetric portion.

According to an exemplary embodiment, a method of manufacturing a semiconductor device, the method comprising forming a plurality of layers at predetermined positions on a semiconductor substrate, and identifying alignments of the layers by measuring overlays of overlay marks using overlay marks, wherein the method of measuring overlays comprises: forming a plurality of virtual overlay marks having a plurality of virtual asymmetric portions, the virtual asymmetric portions having different sizes with respect to a reference model profile of a reference overlay mark; obtaining virtual information of the virtual overlay marks; comparing the virtual information of the virtual overlay marks with actual information of an actual overlay mark to identify virtual information corresponding to the actual information; and measuring an actual overlay of the actual overlay mark using the identified information.

According to exemplary embodiments, the size and the position of the actual asymmetric portion of the actual overlay mark may be accurately detected. Thus, measuring the overlay of the actual overlay mark may be performed under than the actual asymmetric portion may be excluded from the actual overlay mark, so that the overlay may be accurately measured. As a result, errors may not be generated in a correcting process to a layer using the accurate overlay.

BRIEF DESCRIPTION OF THE DRAWINGS

Exemplary embodiments will be more clearly understood from the following detailed description taken in conjunction with the accompanying drawings.

FIG. 1 is a flow chart illustrating a method of measuring an overlay in accordance with exemplary embodiments;

FIG. 2 is a graph showing a profile of a reference overlay mark;

FIG. 3 is a graph showing a model profile obtained from the graph in FIG. 2;

FIGS. 4 and 5 are graphs showing a process for forming virtual overlay marks having virtual asymmetric portions on the model profile in FIG. 3;

FIGS. 6 and 7 are graphs showing changes of center points of the virtual overlay marks due to the virtual asymmetric portions;

FIGS. 8 and 9 are cross-sectional views illustrating an actual overlay mark having an actual asymmetric portion;

FIG. 10 is a graph showing changes of a center point of the actual overlay mark due to the actual asymmetric portion;

FIGS. 11 and 12 are graphs showing changes of the center point of the actual overlay marks due to exclusion of the actual asymmetric portion; and FIGS. 13 and 14 are graphs showing domain expansions to obtain wide margins.

DETAILED DESCRIPTION OF THE EMBODIMENTS

Figure 1:
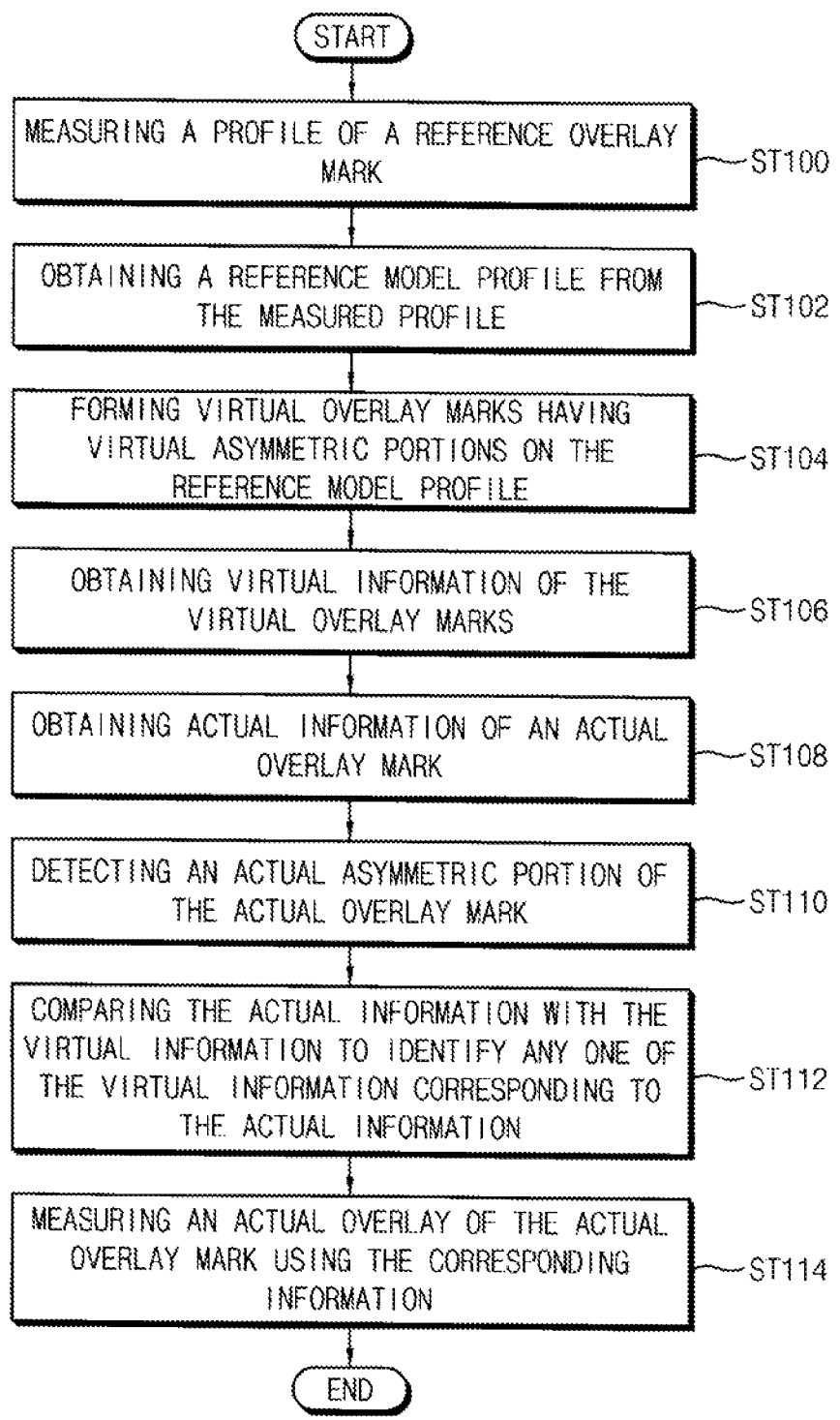
FIGS. 1 to 14 represent non-limiting, exemplary embodiments as described herein.

Various exemplary embodiments will be described more fully hereinafter with reference to the accompanying drawings, in which some example embodiments are shown. The present disclosure may, however, be embodied in many different forms and should not be construed as limited to the example embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. Like numerals refer to like elements throughout. As used herein, the term "and/or" includes any and all combinations of one or more of the associated listed items.

Hereinafter, exemplary embodiments will be explained in detail with reference to the accompanying drawings.

Figure 2:
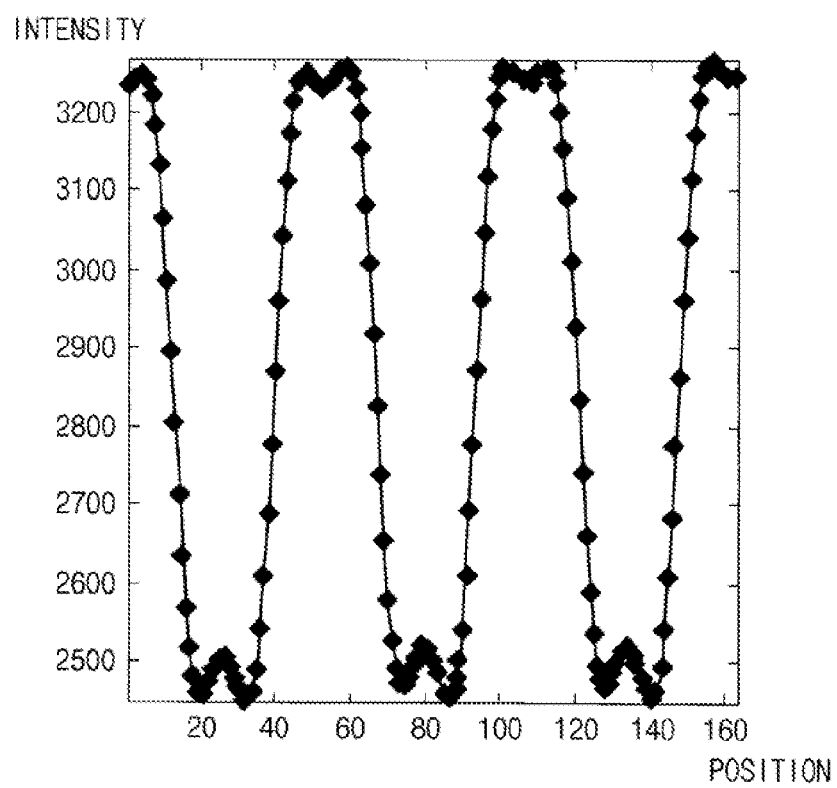
Figure 3:
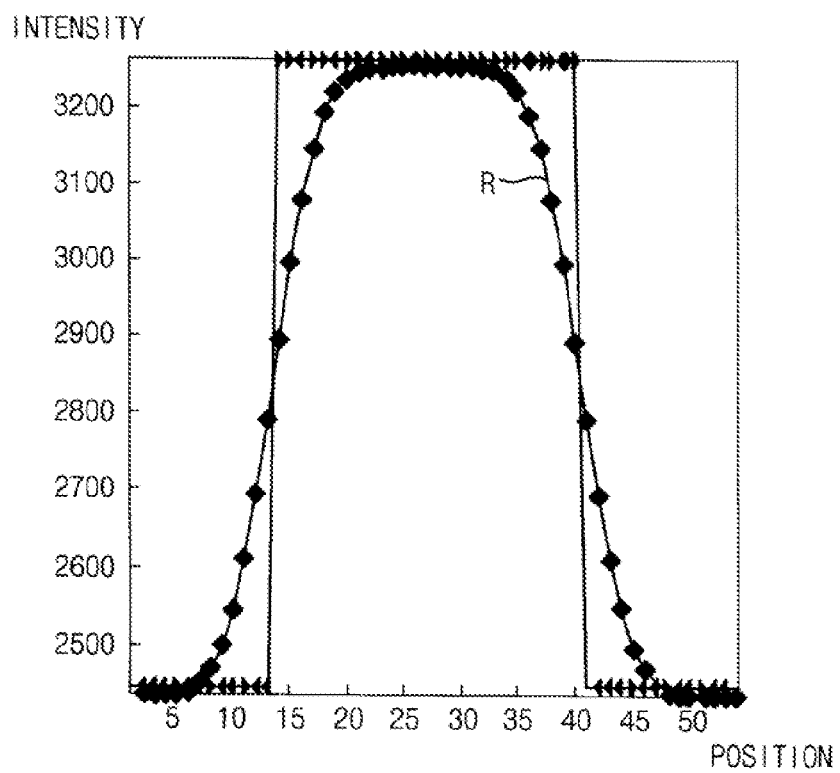
Figure 4:
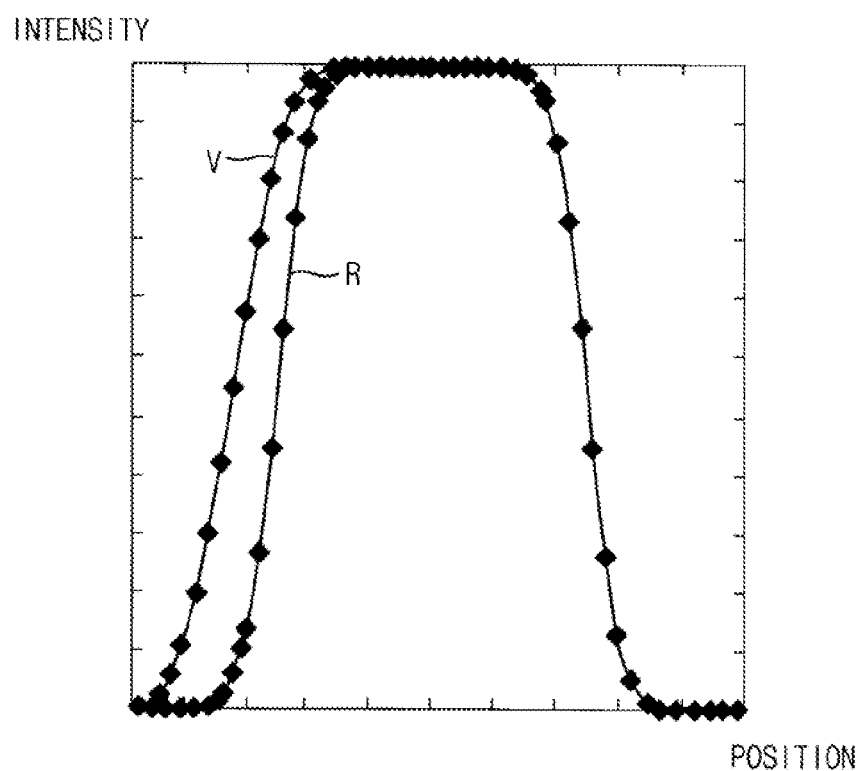
Figure 5:
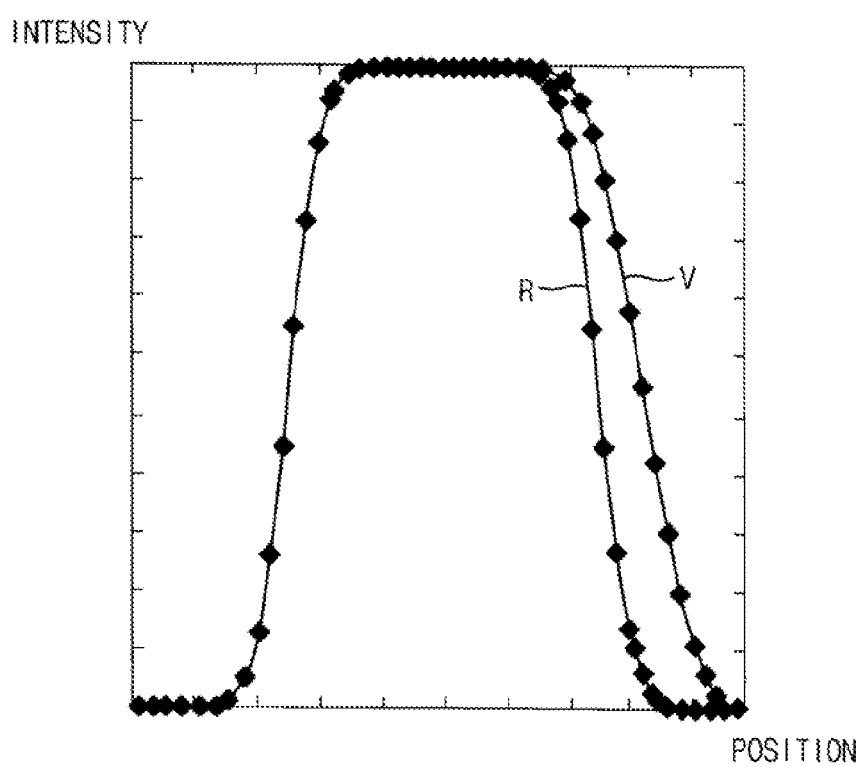
Figure 6:
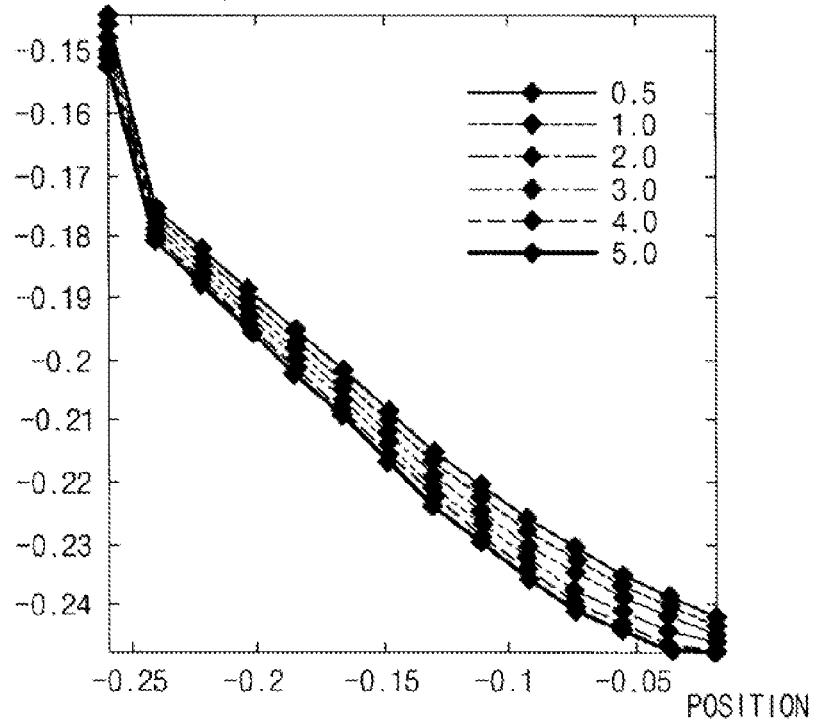
Figure 7:
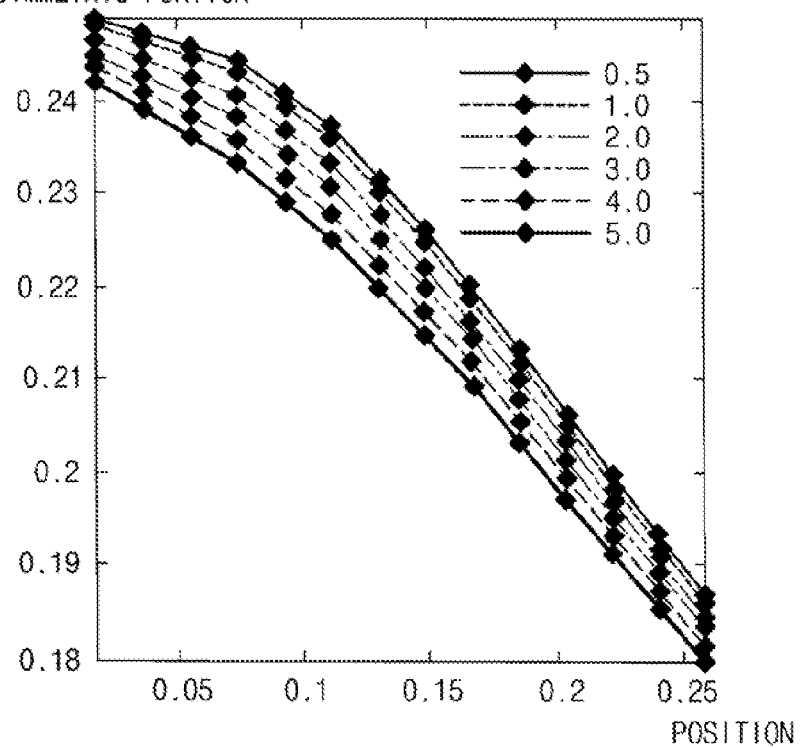
Figure 8:
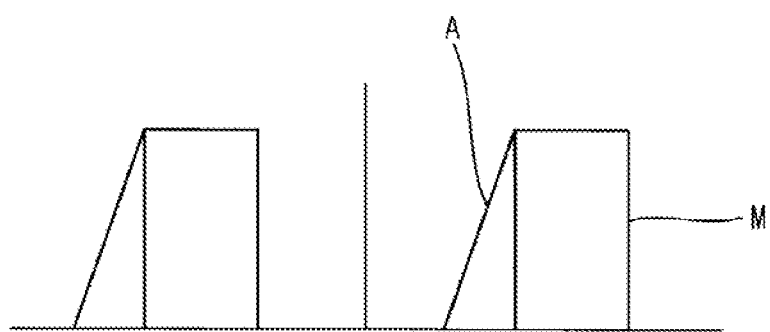
Figure 9:
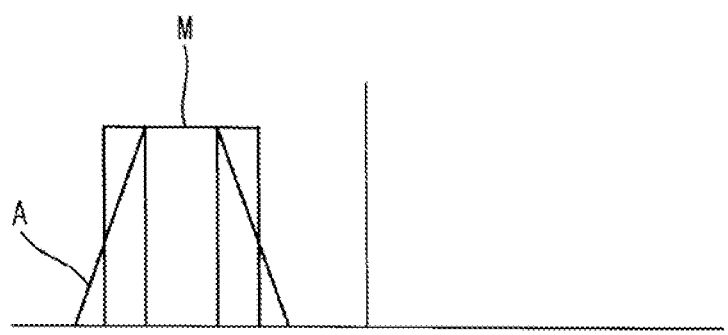
Figure 10:
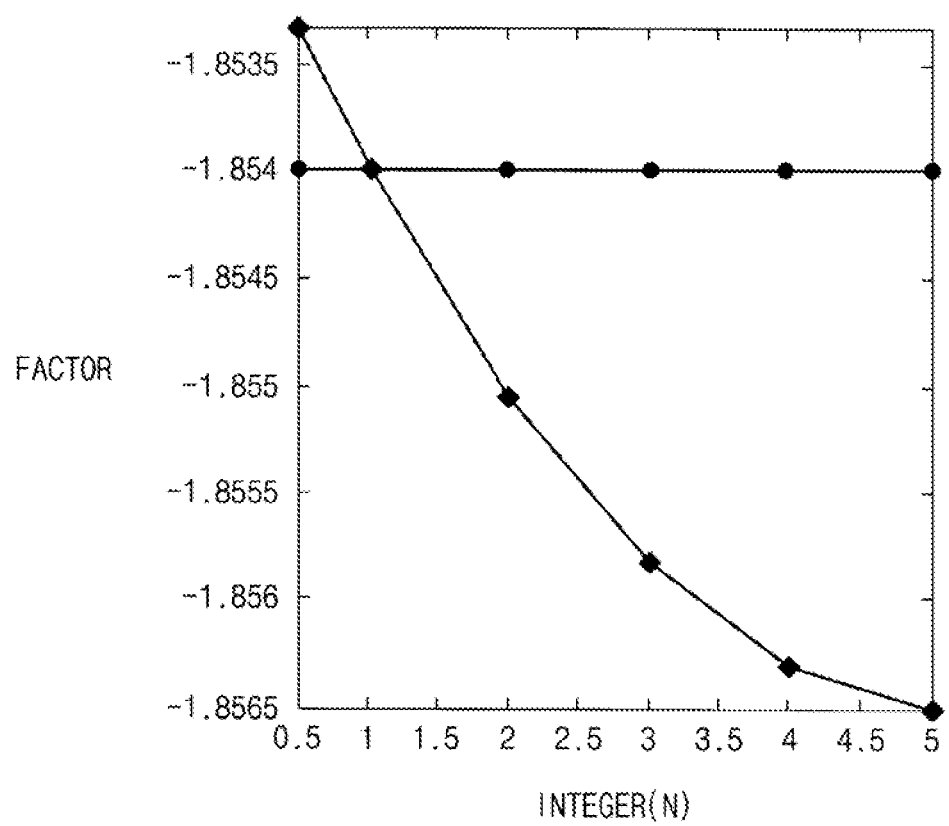
Figure 11:
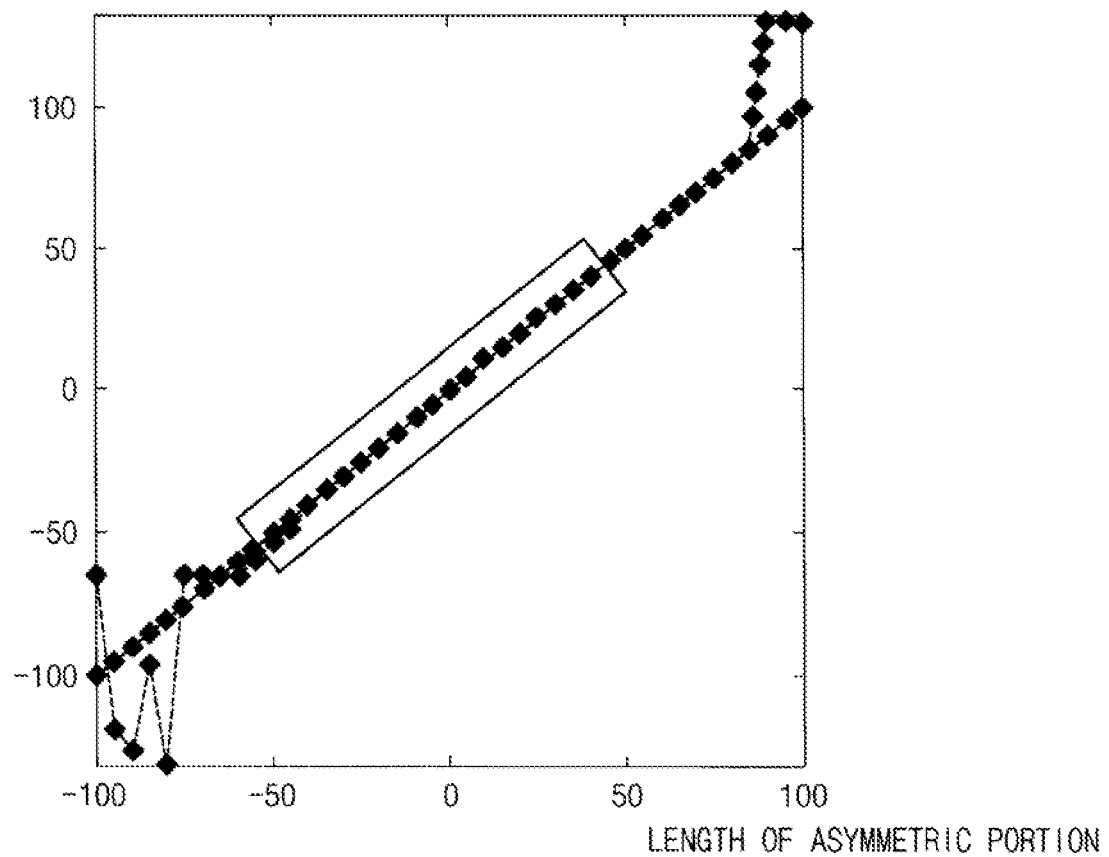
Figure 12:
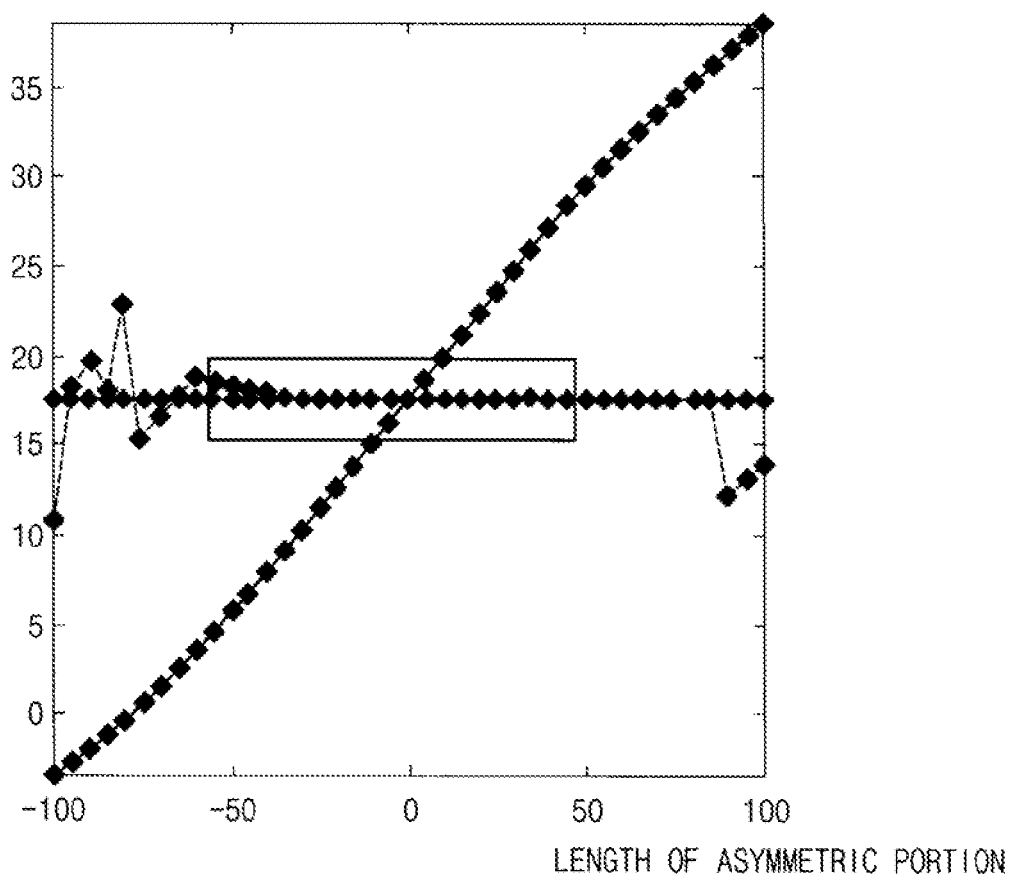
Figure 13:
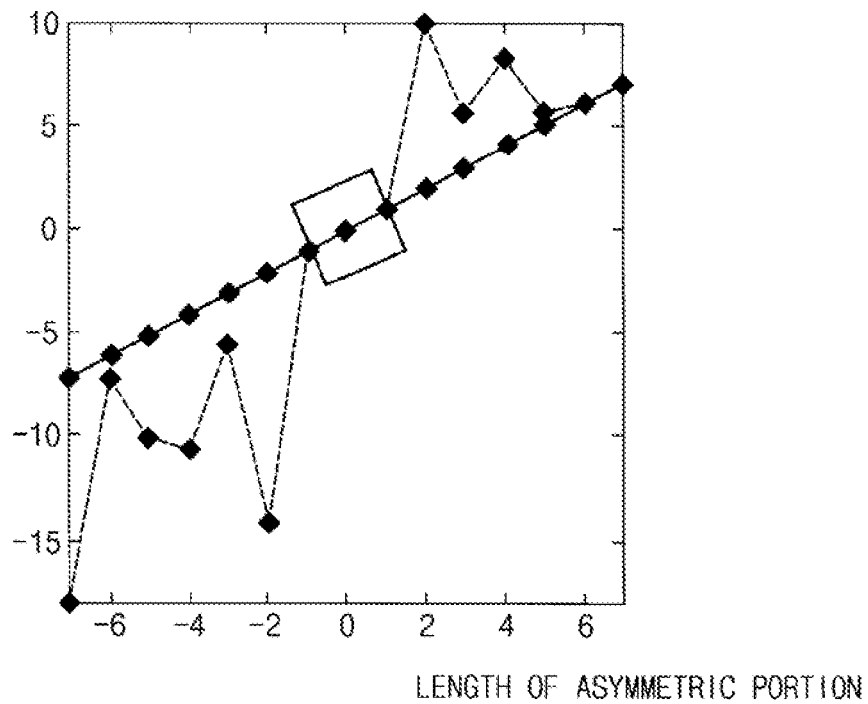
Figure 14:
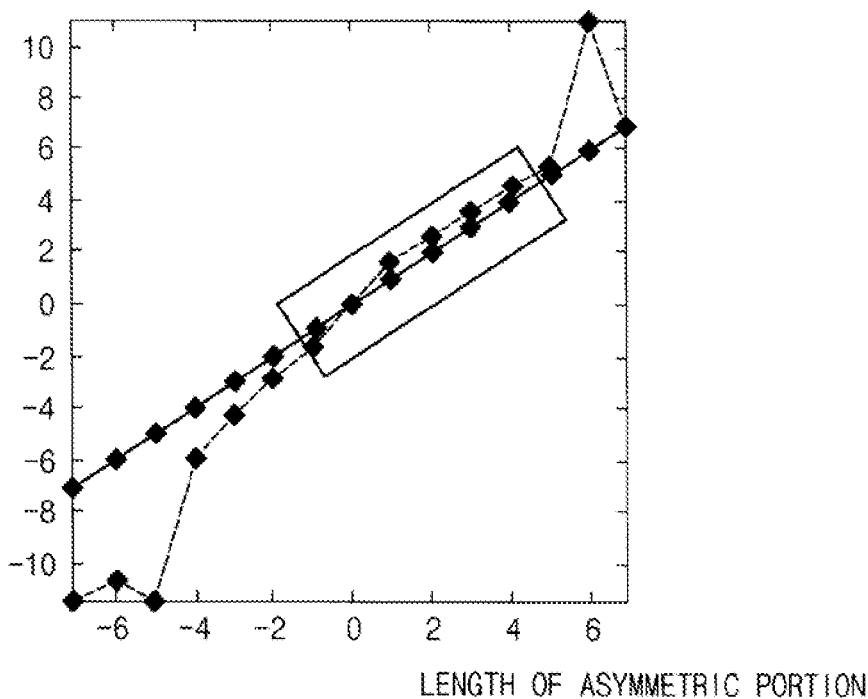

FIG. 1 is a flow chart illustrating a method of measuring an overlay in accordance with exemplary embodiments. FIG. 2 is a graph showing a profile of a reference overlay mark. FIG. 3 is a graph showing a model profile obtained from the graph in FIG. 2. FIGS. 4 and 5 are graphs showing a process for forming virtual overlay marks having virtual asymmetric portions on the model profile in FIG. 3. FIGS. 6 and 7 are graphs showing changes of center points of the virtual overlay marks due to the virtual asymmetric portions. FIGS. 8 and 9 are cross-sectional views illustrating an actual overlay mark having an actual asymmetric portion. FIG. 10 is a graph showing changes of a center point of the actual overlay mark due to the actual asymmetric portion. FIGS. 11 and 12 are graphs showing changes of the center point of the actual overlay marks due to exclusion of the actual asymmetric portion. FIGS. 13 and 14 are graphs showing domain expansions to obtain wide margins.

Referring to FIG. 1, in step ST100, a profile of a reference overlay mark may be obtained. As shown in FIG. 2, the reference overlay mark has a symmetric shape with respect to a center point of the reference overlay mark. That is, the reference overlay mark may lack an asymmetric portion. In FIG. 2, a horizontal axis may represent a position of the reference overlay mark and a vertical axis may represent intensity of the reference overlay mark.

In step ST102, a reference model profile R may be obtained from the profile of the reference overlay mark. In FIG. 3, a horizontal axis may represent a position of the model profile R and a vertical axis may represent intensity of the reference model profile R. As shown in FIG. 3, the reference model profile R may be the profile of the reference overlay mark. The reference model profile R may have a left portion and a right portion symmetric with each other with respect to the center point of the reference overlay mark. Thus, the reference model profile R may lack an asymmetric portion.

In step ST104, virtual overlay marks having virtual asymmetric portions may be formed at the reference model profile R. In FIG. 4, a horizontal axis may represent a position of the model profile R and a vertical axis may represent an intensity of the reference model profile R. As shown in FIG. 4, a virtual asymmetric line V may draw on the reference model profile R. The virtual asymmetric line V may extend from a first point apart from a lower end of a left surface of the reference model profile R through an upper surface of the reference model profile R to a second surface of the reference model profile R substantially opposite to the first surface. The left surface of the reference model profile R may correspond to a first surface of the reference model profile R. The right surface of the reference model profile R may correspond to a second surface of the model profile R. Because a left end of the virtual asymmetric line V may be positioned at the first point apart from the left end of the reference model profile R, the virtual overlay mark drawn by the virtual asymmetric line V may have a left asymmetric portion that protrudes from the reference model profile R.

Referring to FIG. 5, the virtual asymmetric line V may be shifted by substantially the same interval toward the right surface of the reference model profile R. Because the virtual asymmetric line V may be shifted right, a size of the left asymmetric portion of the virtual overlay mark may gradually decrease. In contrast, a size of a right asymmetric portion of the virtual overlay mark may gradually increase. The virtual asymmetric line V may be shifted to a second point apart from a lower end of the second surface of the reference model profile R. Because a right end of the virtual asymmetric line V may be positioned at the second point apart from the right end of the reference model profile R, the virtual overlay mark drawn by the shifted asymmetric line V may have a right asymmetric portion that protrudes from the reference model profile R.

In exemplary embodiments, a distance between the left end of the reference model profile R and the first point may be substantially the same as a distance between the right end of the reference model profile R and the second point. That is, a distance between the center point of the reference model profile R and the first point may be substantially the same as a distance between the center point of the reference model profile R and the second point. The first point and the second point may be determined in accordance with a maximum size, for example, a maximum horizontal distance of an actual asymmetric portion to be formed at an actual overlay mark.

In step ST106, information may be obtained with respect to the virtual overlay marks formed by shifting the virtual asymmetric line V. Because the shifted interval of the virtual asymmetric line V may be previously recognized, a size, a position, a center point, etc., of the virtual asymmetric portion of the virtual overlay mark at each of the points may also be recognized. The size of the asymmetric portion may include a horizontal length of the virtual asymmetric portion. Because the virtual overlay mark may have a fixed height, the size of the virtual asymmetric portion may be calculated from the horizontal distance and the height of the virtual asymmetric portion.

As shown in FIG. 6, the horizontal length of the left asymmetric portion may gradually decrease by right shifting the virtual asymmetric line V. In contrast, as shown in FIG. 7, the horizontal length of the right asymmetric portion may gradually increase by right shifting the virtual asymmetric line V.

In step ST108, information with respect to an actual overlay mark M may be obtained. Referring to FIG. 8, the actual overlay mark M may have an actual asymmetric portion A. The actual asymmetric portion A may be formed at a left surface of the actual overlay mark M. Referring to FIG. 9, an original center point of the actual overlay mark M may be slightly moved to the left by the actual asymmetric portion A. An actual overlay of the actual overlay mark M may be measured. Thus, the information of the actual overlay mark M may include, for example, the measured overlay, an actual overlay, or a horizontal length of the actual asymmetric portion A. The actual overlay may correspond to an overlay of the actual overlay mark M without the actual asymmetric portion A.

In step ST110, the actual asymmetric portion A of the actual overlay mark M may be detected. That is, whether or not the actual asymmetric portion A exists on the actual overlay mark M may be identified. In exemplary embodiments, an actual profile of the actual overlay mark M may be a square integer N. As shown in FIG. 9, a factor may be changed in proportion to an increase of the integers N. The factor may be obtained by dividing a difference between the measured overlay and the actual overlay by the horizontal length of the actual asymmetric portion A. The factor may represent a profile of the center point of the actual overlay mark M. If an actual overlay mark M lacks an actual asymmetric portion A, the factor may not change, like the horizontal straight line in FIG. 10. If an actual overlay mark M does have an actual asymmetric portion A, the factor may change in proportion to an increase of the integers N. That is, the profile of the center point of an actual overlay mark M having an actual asymmetric portion A may change. Whether or not an actual overlay mark M has an actual asymmetric portion A may be accurately identified based on the factor.

In step ST112, the information of the actual overlay mark M may be compared with the information of the virtual overlay marks. As mentioned above, the virtual overlay marks may have virtual asymmetric portions having various shapes to be formed at the actual overlay mark M. Therefore, information of the virtual overlay mark may include information of the actual overlay mark M having a virtual asymmetric portion A. Thus, as shown in FIG. 11, information of the virtual overlay mark corresponding to the information of the actual overlay mark M may be identified. Information of the virtual overlay mark corresponding to the actual overlay mark M may include, for example, the horizontal length and the position of the actual asymmetric portion A, or the center point of the actual overlay mark M.

In step ST114, an actual overlay of the actual overlay mark M may be measured using the corresponding information. The measurement of the actual overlay may lack the actual asymmetric portion A. Thus, the actual overlay may be measured with respect to an actual center point of the actual overlay mark M. Referring to FIG. 12, because the actual asymmetric portion A may be excluded from the actual overlay mark M, the center point of the actual overlay mark M may not change. As a result, the measured actual overlay may have improved reliability.

In exemplary embodiments, information of the virtual overlay marks having virtual asymmetric portions may depend upon a pitch between the actual overlay marks. The virtual asymmetric portions may be located between the actual overlay marks. Thus, as shown in FIG. 13, when the pitch between the actual overlay marks is so narrow, numbers of the virtual asymmetric portions may decrease. As a result, information of the virtual asymmetric portions may also be reduced so that it may be challenging to obtain information of the virtual asymmetric portion corresponding to the information of the actual asymmetric portion.

To address the above-mentioned situation, as shown in FIG. 14, a domain in FIG. 13 may be expanded. Thus, a great amount of information of the virtual asymmetric portions may be obtained from the expanded domain.

According to exemplary embodiments, the size and the position of the actual asymmetric portion of the actual overlay mark may be accurately detected. Since measuring the overlay of an actual overlay mark may be performed while the actual asymmetric portion is excluded from the actual overlay mark, the overlay may be accurately measured. As a result, errors may not be generated in a correcting process to a layer using the accurate overlay.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the present disclosure. Accordingly, all such modifications are intended to be included within the scope of the present disclosure as defined in the claims. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. A method of detecting an asymmetric portion of an overlay mark, the method comprising:

forming a plurality of virtual overlay marks having a plurality of virtual asymmetric portions, the plurality of virtual asymmetric portions having different sizes with respect to a reference model profile of a reference overlay mark;

obtaining virtual information of the plurality of virtual overlay marks; and comparing the virtual information of the plurality of virtual overlay marks with actual information of an actual overlay mark to identify virtual information corresponding to the actual information.

2. The method of claim 1, wherein forming the plurality of virtual overlay marks comprises:

drawing a virtual asymmetric line from a first point, which is apart from a lower end of a first surface of the reference model profile, along a second surface of the reference model profile substantially opposite to the first surface though an upper surface of the reference model profile; and shifting the virtual asymmetric line to a second point apart from a lower end of the second surface.

3. The method of claim 2, wherein a distance between the lower end of the first surface and the first point is substantially the same as a distance between the lower end of the second surface and the second point.

4. The method of claim 2, wherein shifting the virtual asymmetric line comprises shifting the virtual asymmetric line by substantially a same interval.

5. The method of claim 1, further comprising identifying an actual asymmetric portion at the actual overlay mark.

6. The method of claim 5, wherein identifying the actual asymmetric portion comprises:

amplifying an actual model profile of the actual overlay mark; and identifying changes of a center point of the amplified actual model profile.

7. The method of claim 6, wherein amplifying the actual model profile comprises squaring the actual model profile to integers.

8. The method of claim 1, wherein the virtual information of the plurality of virtual asymmetric portions comprises a size and a position of each of the plurality of virtual asymmetric portions.

9. The method of claim 8, wherein the size of the virtual asymmetric portion comprises a horizontal length of the virtual asymmetric portion.

10. A method of measuring an overlay, the method comprising:

forming a plurality of virtual overlay marks having a plurality of virtual asymmetric portions, the plurality of virtual asymmetric portions having different sizes with respect to a reference model profile of a reference overlay mark;

obtaining virtual information of the plurality of virtual overlay marks;

comparing the virtual information of the plurality of virtual overlay marks with actual information of an actual overlay mark to identify virtual information corresponding to the actual information; and measuring an actual overlay of the actual overlay mark using the identified virtual information.

11. The method of claim 10, wherein measuring the actual overlay comprises excluding an actual asymmetric portion of the actual overlay mark.

12. The method of claim 10, further comprising identifying an actual asymmetric portion at the actual overlay mark.

13. The method of claim 12, wherein identifying the actual asymmetric portion comprises:

amplifying an actual model profile of the actual overlay mark; and identifying changes of a center point of the amplified actual model profile.

14. The method of claim 13, wherein amplifying the actual model profile comprises squaring the actual model profile to integers.

15. The method of claim 10, wherein the virtual information of the plurality of virtual asymmetric portions comprises a size and a position of each of the plurality of virtual asymmetric portions, and center points of the plurality of virtual overlay marks.

16. A method of manufacturing a semiconductor device, the method comprising:

forming a plurality of layers at predetermined positions on a semiconductor substrate; and identifying alignments of the plurality of layers by measuring overlays of overlay marks using overlay marks, wherein the method of measuring overlays comprises:

forming a plurality of virtual overlay marks having a plurality of virtual asymmetric portions, the plurality of virtual asymmetric portions having different sizes with respect to a reference model profile of a reference overlay mark;

obtaining virtual information of the plurality of virtual overlay marks;

comparing the virtual information of the plurality of virtual overlay marks with actual information of an actual overlay mark to identify virtual information corresponding to the actual information; and measuring an actual overlay of the actual overlay mark using the identified virtual information.

17. The method of claim 16, wherein measuring the actual overlay comprises excluding an actual asymmetric portion of the actual overlay mark.

18. The method of claim 16, further comprising identifying an actual asymmetric portion at the actual overlay mark.

19. The method of claim 18, wherein identifying the actual asymmetric portion comprises:

amplifying an actual model profile of the actual overlay mark; and identifying changes of a center point of the amplified actual model profile.

20. The method of claim 19, wherein amplifying the actual model profile comprises squaring the actual model profile to integers.

* * * * *